United States Patent
Prabhu et al.

(10) Patent No.: US 8,033,895 B2
(45) Date of Patent: Oct. 11, 2011

(54) RETAINING RING WITH SHAPED PROFILE

(75) Inventors: Gopalakrishna B. Prabhu, San Jose, CA (US); Yin Yuan, Sunnyvale, CA (US); Jeonghoon Oh, Sunnyvale, CA (US); Gregory E. Menk, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 206 days.

(21) Appl. No.: 11/780,335

(22) Filed: Jul. 19, 2007

(65) Prior Publication Data

US 2009/0021024 A1    Jan. 22, 2009

(51) Int. Cl.
*B24B 7/22*    (2006.01)
(52) U.S. Cl. ............... 451/286; 451/287; 451/398
(58) Field of Classification Search .......... 451/41, 451/285–290, 398
See application file for complete search history.

(56) References Cited

U.S. PATENT DOCUMENTS

| | | | |
|---|---|---|---|
| 5,597,346 A * | 1/1997 | Hempel, Jr. ............ | 451/287 |
| 5,695,392 A * | 12/1997 | Kim ...................... | 451/288 |
| 5,738,574 A | 4/1998 | Tolles et al. | |
| 6,224,472 B1 * | 5/2001 | Lai et al. ............... | 451/398 |
| 6,251,215 B1 | 6/2001 | Zuniga et al. | |
| 6,893,327 B2 | 5/2005 | Kajiwara et al. | |
| 6,962,520 B2 | 11/2005 | Taylor | |
| 6,974,371 B2 | 12/2005 | Chen et al. | |
| 7,121,927 B2 | 10/2006 | Phang et al. | |
| 7,575,504 B2 * | 8/2009 | Zuniga et al. ......... | 451/288 |
| 2005/0113002 A1 * | 5/2005 | Chen et al. ............ | 451/42 |
| 2005/0126708 A1 | 6/2005 | Chen et al. | |
| 2005/0191947 A1 * | 9/2005 | Chen et al. ............ | 451/41 |
| 2006/0240750 A1 * | 10/2006 | Oh et al. ............... | 451/285 |
| 2007/0143980 A1 | 6/2007 | Doan et al. | |
| 2007/0224864 A1 | 9/2007 | Burns et al. | |
| 2008/0160885 A1 * | 7/2008 | Winterlich et al. ..... | 451/286 |
| 2008/0196833 A1 * | 8/2008 | Chen et al. ............ | 451/41 |

FOREIGN PATENT DOCUMENTS

| | | |
|---|---|---|
| DE | 10332624 | 2/2005 |
| JP | 2005005398 | 1/2005 |

OTHER PUBLICATIONS

International Search Report and the Written Opinion of International Application Serial No. PCT/US2008/070463, dated Oct. 29, 2008, 10 pages.

* cited by examiner

*Primary Examiner* — Maurina Rachuba (74) *Attorney, Agent, or Firm* — Fish & Richardson P.C.

(57) ABSTRACT

Retaining rings with curved surfaces are described. The curved surfaces prevent damage to a fixed abrasive polishing pad when the retaining ring is used in a polishing process. The curved surfaces are on the bottom surface of the ring, such as along the outer diameter and/or along the sidewalls of channels formed in the bottom of the ring.

14 Claims, 6 Drawing Sheets

RETAINING RING WITH SHAPED PROFILE

BACKGROUND

This invention relates to chemical mechanical polishing of semiconductors.

An integrated circuit is typically formed on a substrate by the sequential deposition of conductive, semiconductive or insulative layers on a silicon substrate. One fabrication step involves depositing a filler layer over a non-planar surface, and plananzing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization is needed to planarize the substrate surface for photolithography.

Chemical mechanical polishing (CMP) is one accepted method of planarization. This planarization method typically requires that the substrate be mounted on a carrier or polishing head of a CMP apparatus. The exposed surface of the substrate is placed against a rotating polishing disk pad or belt pad. The polishing pad can be either a standard pad or a fixed-abrasive pad. A standard pad has a durable roughened surface, whereas a fixed-abrasive pad has abrasive particles held in a containment media. The carrier head provides a controllable load on the substrate to push it against the polishing pad. The carrier head has a retaining ring which holds the substrate in place during polishing. A polishing liquid, such as a slurry with abrasive particles, is supplied to the surface of the polishing pad.

SUMMARY

In one embodiment, a retaining ring for chemical mechanical polishing is described. The retaining ring has annular ring having a bottom surface configured to contact a polishing pad during polishing, wherein the bottom surface has a plurality of channels, each channel defined by sidewalls, at least one corner between at least one of the sidewalls and the bottom surface has a first radius of curvature and a corner between an outer diameter of the annular ring and the bottom surface has a second radius of curvature.

In another embodiment, a retaining ring is described that has an annular ring having a bottom surface configured to contact a polishing pad during polishing, wherein the bottom surface has a plurality of channels, each channel defined by sidewalls, and a corner between one of the sidewalls and the bottom surface is chamfered.

The retaining rings can have one or more of the following features. The first radius of curvature can be equal to the second radius of curvature. The first radius of curvature can be at least 120 mils. At least one of the channels can have a width adjacent an inner diameter of the retaining ring that is less than a width adjacent to an outer diameter of the retaining ring. The at least one channel can have a third radius of curvature that defines a portion of the channel that flares out to the width adjacent to the outer diameter. The base of the channel can be u-shaped. The channel can have a constant depth from the inner diameter to the outer diameter. The channel can be deeper at one end.

The retaining ring can be used by retaining a substrate with the retaining ring, applying a polishing liquid to a fixed abrasive polishing pad and creating relative motion between the substrate and the fixed abrasive polishing pad.

A system including the retaining ring can also comprise a carrier head, to which the retaining ring is attached and a platen configured to support the polishing pad and retaining ring during polishing.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 1-3 are a perspective bottom views of part of a retaining ring.

Like reference symbols in the various drawings indicate like elements.

DETAILED DESCRIPTION

Referring to FIG. 1, a substrate can be held by a retaining ring 101 secured to a carrier head for polishing by a chemical mechanical polishing (CMP) apparatus. A suitable carrier head is described in U.S. Pat. No. 6,251,215, and a description of a CMP apparatus may be found in U.S. Pat. No. 5,738,574; the entire disclosures of these references are hereby incorporated by reference.

The retaining ring 101 (only part of which is shown) can be constructed from two rings, a lower ring 105 and an upper ring 110. The lower ring 105 has a lower surface 107 that can be brought into contact with a polishing pad. The lower ring 105 has an inner diameter 112 and an outer diameter 114. Individual portions of the lower surface 107 of the lower ring 105 are bounded by corners, such as the OD corner 120 between the lower surface 107 and the outer diameter 114. Then OD corners 120 are free of sharp edges. That is, the corners can be rounded or chamfered. In some embodiments, the ID corner 109, the corner between the inner diameter 112 and the lower surface 107, has a sharp edge. The lack of sharp edges along surfaces that contact the polishing pad can minimize one source of damage to a polishing pad during polishing.

In some embodiments, the retaining ring 101 has one or more channels 125. The channels 125 allow slurry to flow under the retaining ring 101 during polishing. Corners 130 of the lower surface 107 that are on either side of the channels 125 can be similarly chamfered or provided with a radius that further reduces or eliminates sharp corners on the bottom of the retaining ring 101.

The lower ring 105 can be formed of a material which is chemically inert in a CMP process, such as a plastic, e.g., polyphenylene sulfide (PPS), polyetheretherketone (PEEK), carbon filled PEEK, Teflon® filled PEEK, polyethylene terephthalate (PET), polybutylene terephthalate (PBT), polytetrafluoroethylene (PTFE), polybenzimidazole (PBI), polyetherimide (PEI), or a composite material. The lower ring should also be durable and have a low wear rate. In addition, the lower ring should be sufficiently compressible so that contact of the substrate edge against the retaining ring does not cause the substrate to chip or crack. On the other hand, the lower ring should not be so elastic that downward pressure on the retaining ring causes the lower ring to extrude into the substrate receiving recess 140 (shown in FIG. 6).

The upper ring 110 of the retaining ring 101 can be formed of a material that is more rigid than the lower ring 105. The rigid material can be a metal, e.g., stainless steel, molybdenum, or aluminum, or a ceramic, e.g., alumina, or other exemplary materials. The upper ring 110 has a lower surface and an upper surface.

The lower and upper rings 105, 110 together form the retaining ring 101. When the two rings are joined, the upper surface of the lower ring 105 is positioned adjacent to the lower surface of the upper ring 110. The two rings generally have substantially the same dimensions at the inner and outer diameters at their inner surface such that the two rings 105, 110 form a flush surface where the two rings 105, 110 meet when they are joined.

The upper surface (not shown) of the upper ring 110 generally includes holes with screw sheaths to receive fasteners, such as bolts, screws, or other hardware, for securing the retaining ring 101 to the carrier head. The holes can be evenly spaced around the carrier head. Additionally, one or more alignment features, such as apertures or projections (not shown), can be located on the top surface of the upper ring 110. If the retaining ring has an alignment aperture, the carrier head can have a corresponding pin that mates with the alignment aperture when the carrier head and retaining ring are properly aligned. In some implementations, the retaining ring 101 has one or more through holes (not shown) that extend from the inner diameter to the outer diameter for allowing slurry or air to pass from the interior of the ring to the exterior, or from the exterior to the interior, of the ring during polishing.

The two rings can be attached with an adhesive layer in the interface between the two rings. The adhesive layer can be a two-part slow-curing epoxy. Slow curing generally indicates that the epoxy takes on the order of several hours to several days to set. However, the epoxy curing cycle can be shortened with elevated temperature. For example, the slow curing epoxy may be Magnobond-6375™, available from Magnolia Plastics of Chamblee, Ga. Alternatively, the epoxy can be a fast curing epoxy. In certain implementations, the epoxy is a high temperature epoxy. High temperature epoxy resists degradation of the adhesive layer 215 due to high heat during the polishing process. In certain implementations, the epoxy includes polyamide, such as 60% to 100% polyamide, and aliphatic mines, such as 10% to 30% of a first aliphatic amine, and 5% to 10% of a second aliphatic amine. For example, the high temperature epoxy may be LOCTITE® Hysol® E-120HP™ from Henkel Corporation of Rocky Hill, Conn. In particular, LOCTITE® Hysol® E-120HP™ better resists degradation as compared to other adhesives, and consequently reduced failure due to delamination. Degradation can be caused by high heat, fatigue, deionized water contact and absorption, and chemical attack from the slurry used in the polishing process.

As an alternative to bonding the two rings together, the rings can be pressure fit or snap fit together, or have interlocking portions such as described in U.S. Pat. No. 6,974,371 which is incorporated herein for all purposes, or fastened together with a mechanical fastener, such as a bolt, a screw or a clamping device, as described in U.S. Published Application No. 2007-0143980, which is incorporated herein for all purposes.

Referring to FIG. 2, in some embodiments, the channels 125 have parallel walls at the portion of the channel adjacent to the inner diameter 112 and the channels widen as they approach the outer diameter 11. The portion of the channel that is adjacent to the outer diameter is referred to as the mouth 145 of the channel. The mouth 145 can be flared, e.g., triangular in shape. In some embodiments, the portion of the channel adjacent to the inner diameter is not flared.

In addition to the portions of the lower surface 107 having bullnosed corners, the portion 160 of the channel that widens can also be curved or have a radius of curvature. The radius of curvature $R_1$ of the corners 120 or corners 130 can be between about 20 and 120 mils, such as between about 30 and 100 mils, such as about 90 mils. The radius of curvature $R_1$ is about an axis parallel to the channel axis. The radius of curvature $R_2$ of the flared portion 160 of the channel can be between about 20 and 200 mils, such as between about 40 and 280 mils, 60 and 260 mils, 80 and 240 mils, 100 and 200 mils, 120 and 180 mils or about 150 mils. The radius of curvature $R_2$ is measured about an axis perpendicular to the lower surface 107 of the retaining ring 101. The radius of curvature can be constant or can change along the curve.

Figure 3:
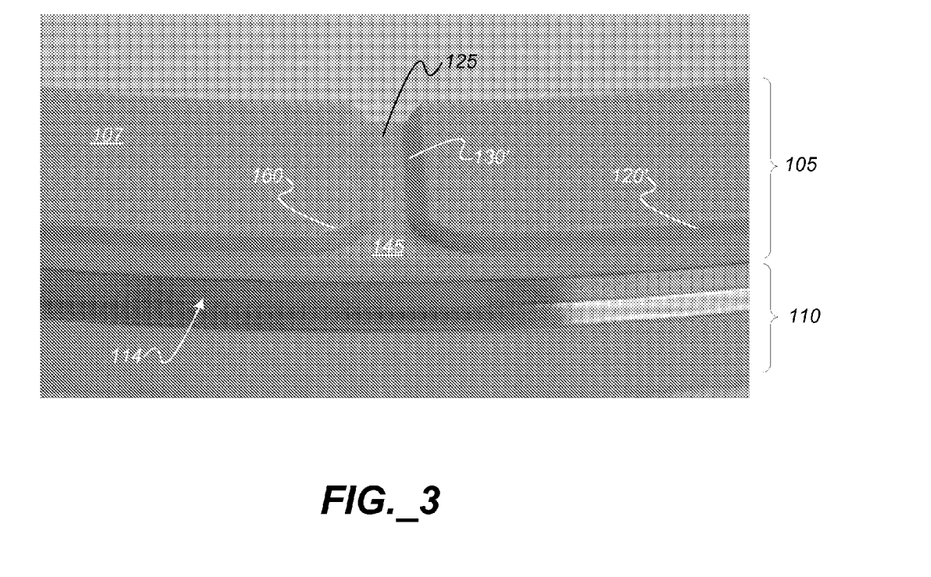
Figure 4:
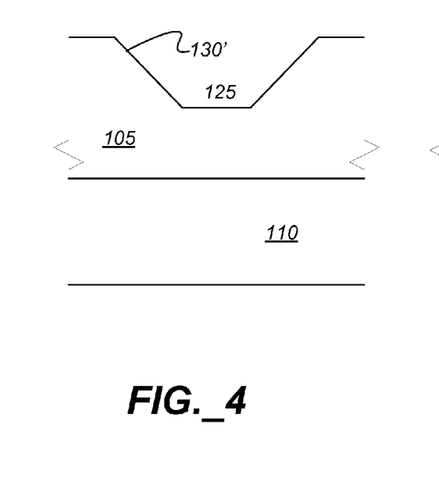
FIGS. 4-5 are side views of part of a retaining ring.
Figure 5:
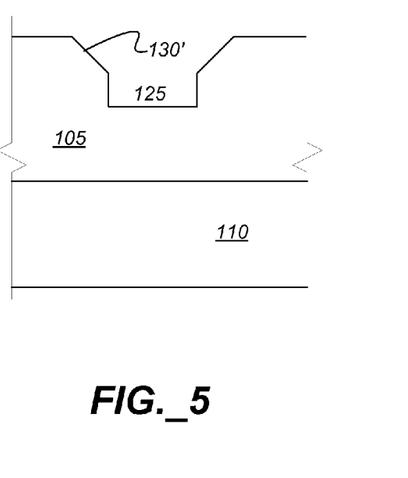

Referring to FIG. 3, the corners 120' and 130' can be chamfered or tapered instead of being bullnosed. An appropriate angle for chamfering can be between about 30° and 60°, such as about 45°. As shown in FIGS. 4 and 5, the chamfering can extend all the way to the base of the channel 125 or can extend part way down the channel.

Figure 6:
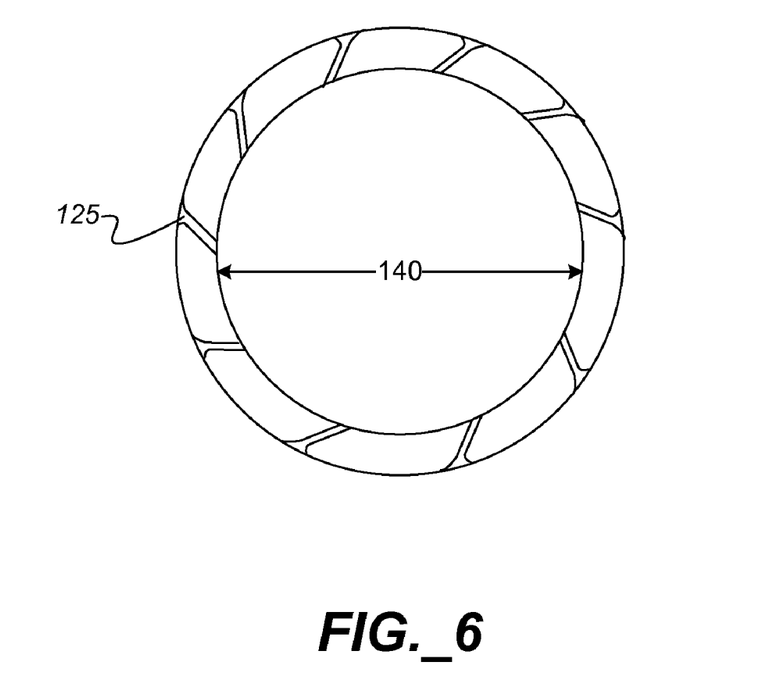
FIGS. 6-7 are bottom view of a retaining ring.
Figure 7:
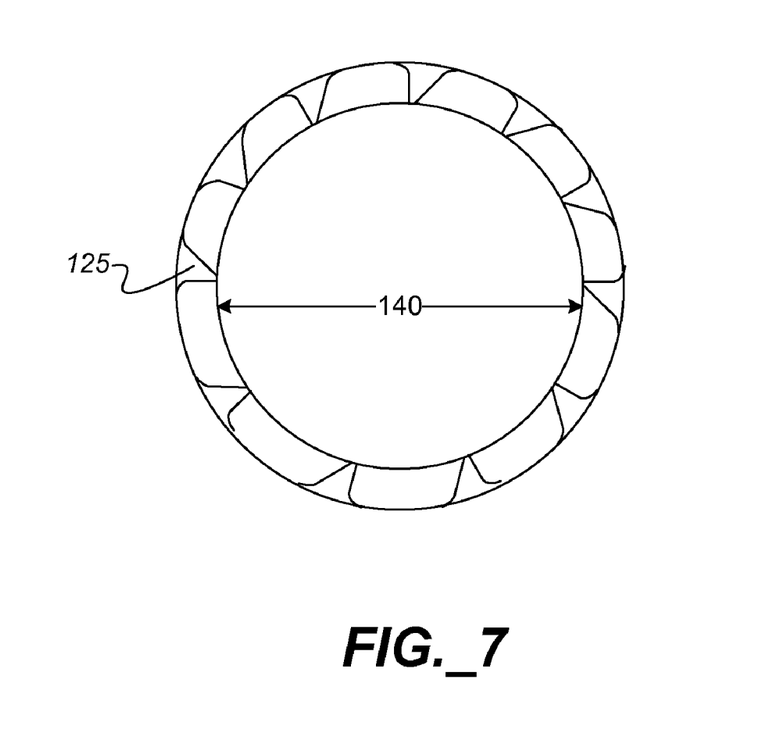

The retaining rings shown in FIGS. 1-3 have grooves that extend substantially parallel with the radii of the retaining ring 101. Referring to FIG. 6, the grooves 125 can be at an angle to the radii of the retaining ring 101, such as at an angle of between about 15° and 60°, such as around 45°. Referring to FIG. 7, the grooves can have sidewalls that are not parallel to one another, but diverge from the inner diameter to the outer diameter. The diverging sidewalls can be in combination with either straight (parallel to the radii) or angled (at an angle to the radii) grooves.

Figure 8:
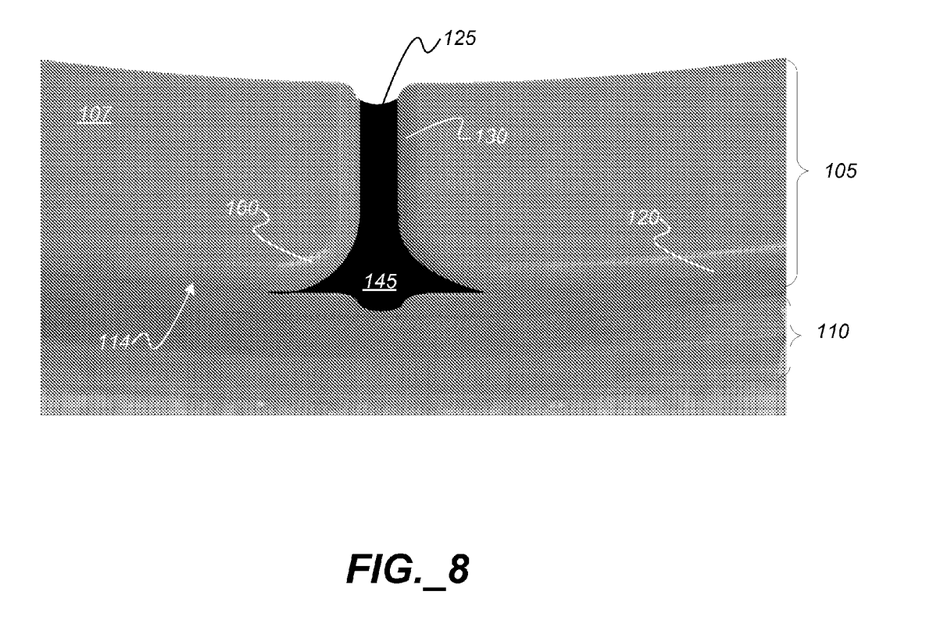
FIG. 8 is a perspective bottom view of part of a retaining ring.
Figure 9:
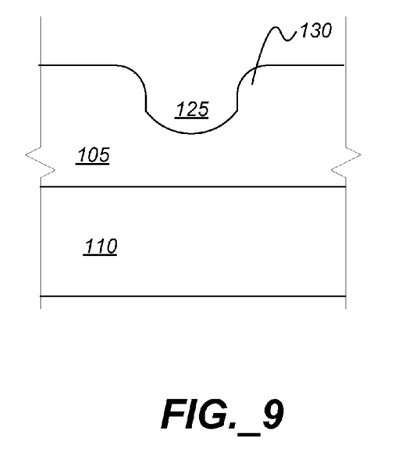
FIG. 9 is a cross-sectional view through a channel in part of the retaining ring of FIG. 8.

In addition to having rounded corners, in some embodiments the base of the channel can be rounded as well. Referring to FIGS. 8-9, the channel 125 is U-shaped or has a semi-circular base. The sidewalls can either be parallel to one another or can diverge from the inner diameter toward the outer diameter or from the outer diameter toward the inner diameter 114. Further, the depth of the groove, that is, the distance from the lower surface 107 to the base of the channel 125, can remain constant from the inner diameter 112 to the outer diameter. Alternatively, the depth of the channel can vary along the length of the channel. In some embodiments, the channel is deeper at the inner diameter than at the outer diameter. In some embodiments, the channel is shallower at the inner diameter than at the outer diameter. In a lower ring 105 having a thickness of about 225 mils, the channel can be between about 50 and 200 mils, such as between about 75 and 150 mils, for example, 120 mils.

In some embodiments, the corner between the lower surface 107 and the inner diameter 112 is not rounded or chamfered. An abrupt edge on this corner can prevent the substrate from slipping under the ring during polishing.

Figure 10:
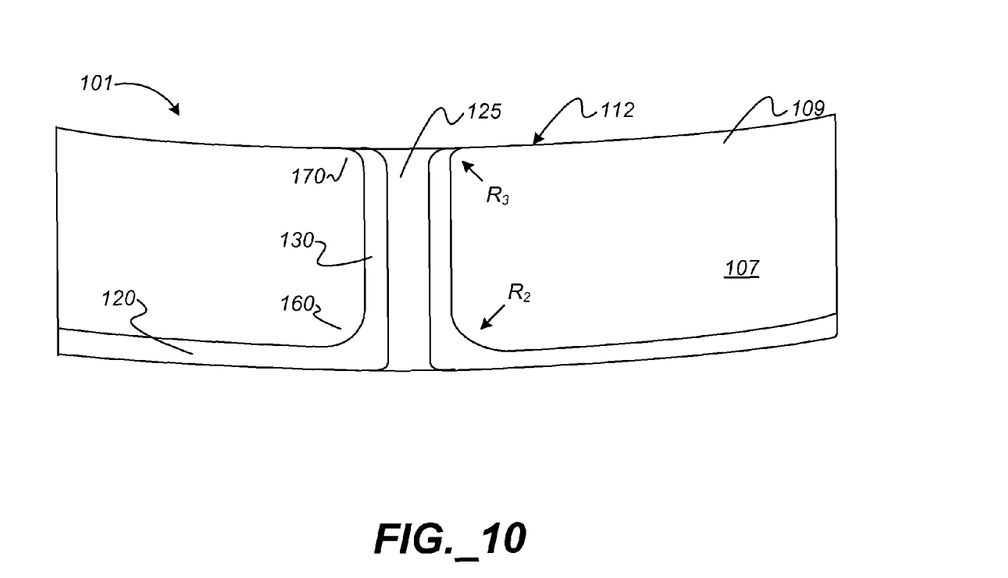
FIG. 10 is a bottom view of a retaining ring.

Referring to FIG. 10, in some embodiments, the corner 170 on the lower surface 107 that is adjacent to the inner diameter 112 and the channel 125 can also be rounded. The radius of curvature $R_3$ of the corner 170 is less than the radius of curvature of the corner 160, $R_2$. In some embodiments, the radius of curvature $R_3$ is between about 30 and 120 mils, such as about 90 mils.

Figure 11:
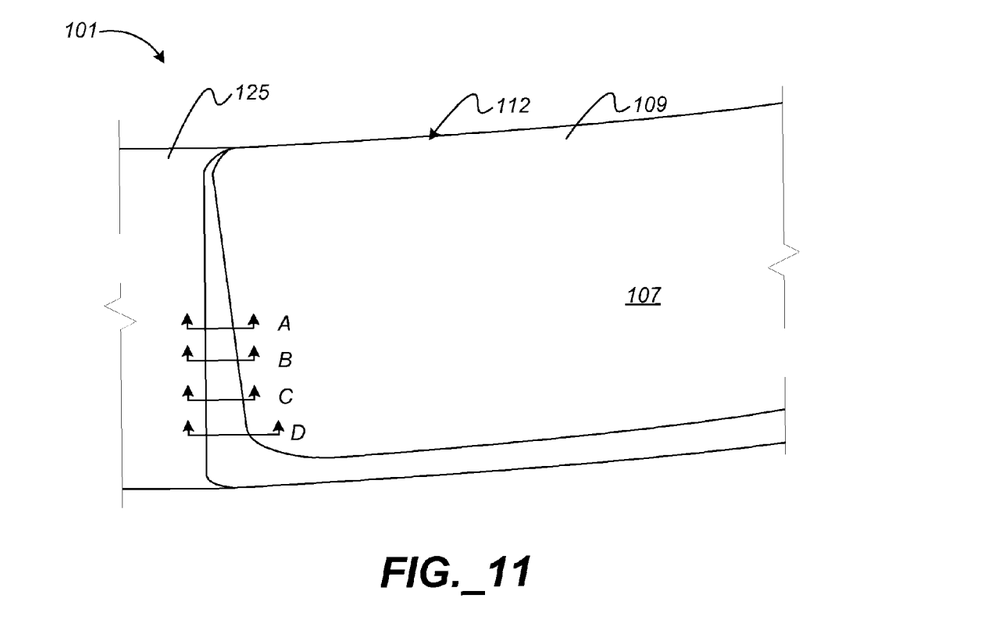
FIG. 11 is a partial bottom view of a retaining ring with a graduated radii.
Figure 11A:
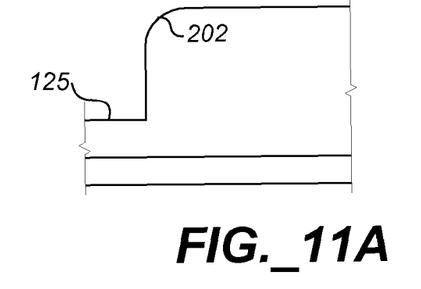
FIGS. 11A-11D are cross sectional views of the graduated radii.
Figure 11B:
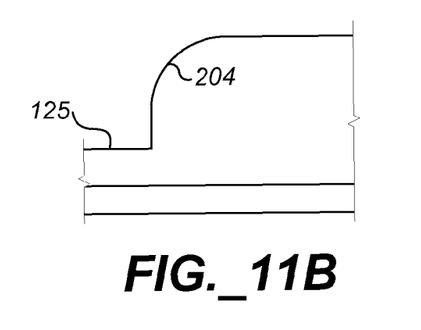
Figure 11C:
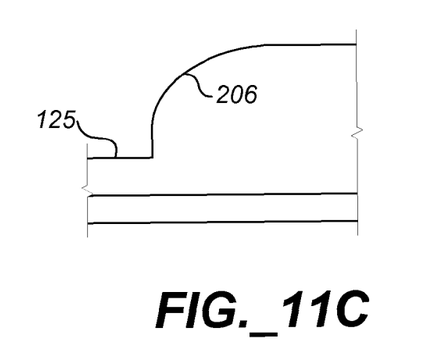
Figure 11D:
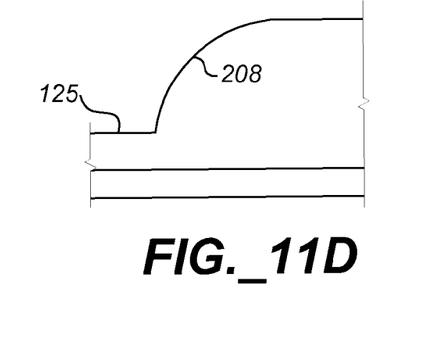

Referring to FIGS. 11-11D, in some embodiments, the radius of curvature are graduated or change along the length of the channel 125. That is, the radius of curvature when viewed along a cross section of the channel 125 can increase or decrease along the length of the channel. In some embodiments, such as the embodiments shown, the radius of curvature increases from the inner diameter of the retaining ring to the outer diameter of the retaining ring. The radius of curvature 202 closest to the inner diameter 112 is smallest, the radius of curvature 204 is larger, the radius of curvature 206, which is closer to the outer diameter 114 than radii 202 and 204, is larger than the radii of curvature closer to the inner diameter 112 and the radius of curvature 208 closest to the outer diameter 114 is the largest. In some embodiments, the radius of curvature also decreases moving along the outer diameter and away from the channel 125.

To polish a substrate with one of the retaining rings described herein, a carrier head with a retaining ring attached moves a substrate from a transfer station to polishing station on a CMP apparatus. During CMP polishing, the carrier head applies pressure to the substrate and holds the substrate against the polishing pad, which is supported by a platen. In some embodiments, the polishing pad is a fixed abrasive polishing pad. A relative motion is created between the substrate and the polishing pad, such as by rotating the platen, rotating the carrier head, translating the carrier head, or some combination thereof. During the polishing sequence, the substrate is located within the receiving recess 140, which prevents the substrate from escaping. The channels 125 in the retaining ring 101 facilitate the transport of slurry to and from the substrate when the retaining ring 101 is in contact with the polishing pad. The rounded corners in the retaining ring 101 reduce damage to the fixed abrasive polishing pad. Once polishing is completed, the substrate is moved to the next step of the polishing sequence.

The retaining rings described herein have one or more bullnose or chamfered corners around each channel and/or at the corner that is between the lower surface 107 and the outer diameter 114. The non-right angled corners prevent the retaining ring from damaging a polishing pad, particularly a fixed abrasive polishing pad, during the polishing process. Fixed abrasive polishing pads tend to be very sensitive to sharp corners. Sharp corners tend to slough off or dig into fixed abrasive polishing pads. Removing the sharp corners from the retaining ring can minimize one of the sources of damage to the pad. Because the pad is less likely to be damaged, the pad has a longer useful life. A longer useful life translates to less down time of the polishing apparatus for changing the polishing pad and requalification of the apparatus and therefore more productive polishing time.

In addition to increasing the useful life of the polishing pad, the retaining rings described herein can reduce the amount of fixed abrasive material that is liberated from the polishing pad during polishing. Because there is less abrasive material free on the surface of the polishing pad, the probability of scratching the wafers and creating defects can be reduced. Rounded edges on the retaining ring surfaces that contact the polishing pad reduce or eliminate polishing pad conditioning or activation attributable to the retaining ring topography.

Yet another benefit of the retaining ring with rounded edges is the reduced break-in time. Many new retaining rings require some break-in period before being used to polishing substrate. The amount of break in time can be reduced by rounding the edges of the retaining ring features.

A number of embodiments of the invention have been described. Nevertheless, it will be understood that various modifications may be made without departing from the spirit and scope of the invention. For example, features of the various retaining rings described herein can be used with other retaining rings described herein or other retaining ring features. The features that are described herein for use on two part rings can also be used with single piece rings. Accordingly, other embodiments are within the scope of the following claims.

What is claimed is:

1. A retaining ring for chemical mechanical polishing, comprising:
   an annular ring having a bottom surface configured to contact a polishing pad during polishing, wherein the bottom surface has a plurality of channels, each channel of the plurality of channels defined by sidewalls, wherein corners between the sidewalls and the bottom surface have a first radius of curvature, a corner between an outer diameter of the annular ring and the bottom surface has a second radius of curvature, corners between the sidewalls and the outer diameter have a third radius of curvature that defines a first flared portion of the channel that flares out to a width adjacent the outer diameter, corners between the sidewalls and an inner diameter have a fourth radius of curvature that defines a second flared portion of the channel that flares out to a width adjacent to the inner diameter, the width adjacent the inner diameter of the retaining ring is less than the width adjacent to the outer diameter of the retaining ring, and the sidewalls are substantially parallel to one another along a length of the channel between the first flared portion and the second flared portion.

2. The retaining ring of claim 1, wherein the first radius of curvature is equal to the second radius of curvature.

3. The retaining ring of claim 1, wherein the first radius of curvature is at least 120 mils.

4. The retaining ring of claim 1, wherein a base of the channel is u-shaped.

5. The retaining ring of claim 1, wherein the channel has a constant depth from the inner diameter to the outer diameter.

6. The retaining ring of claim 1, wherein the channel is deeper at one end.

7. A method of using the retaining ring of claim 1, comprising:
   retaining a substrate with the retaining ring of claim 1;
   applying a polishing liquid to a fixed abrasive polishing pad; and
   creating relative motion between the substrate and the fixed abrasive polishing pad.

8. A system for chemical mechanical polishing, comprising:
   a carrier head;
   a retaining ring attached to the carrier head, wherein the retaining ring comprises an annual portion having a bottom surface configured to contact a polishing pad during polishing, wherein the bottom surface has a plurality of channels, each channel of the plurality of channels defined by sidewalls, wherein corners between the sidewalls and the bottom surface have a first radius of curvature, a corner between an outer diameter of the annular ring and the bottom surface has a second radius of curvature, corners between the sidewalls and the outer diameter have a third radius of curvature that defines a first flared portion of the channel that flares out to a width adjacent the outer diameter, corners between the sidewalls and an inner diameter have a fourth radius of curvature that defines a second flared portion of the channel that flares out to a width adjacent to the inner diameter, width adjacent the inner diameter of the retaining ring is less than the width adjacent to the outer diameter of the retaining ring, and the sidewalls are substantially parallel to one another along a length of the channel between the first flared portion and the second flared portion; and a platen configured to support the polishing pad and retaining ring during polishing.

9. The retaining ring of claim 1, wherein the first radius of curvature is between 20 and 120 mils.

10. The retaining ring of claim 1, wherein the fourth radius of curvature is less than the third radius of curvature.

11. The retaining ring of claim 10, wherein the third radius of curvature is between about 60 and 260 mils.

12. The retaining ring of claim 10, wherein the fourth radius of curvature is between about 30 and 120 mils.

13. The retaining ring of claim 1, wherein the first radius of curvature increases from the inner diameter to the outer diameter along the channel.

14. The retaining ring of claim 1, wherein the plurality of channels are parallel with radii of the retaining ring.

* * * * *

UNITED STATES PATENT AND TRADEMARK OFFICE
CERTIFICATE OF CORRECTION

PATENT NO. : 8,033,895 B2
APPLICATION NO. : 11/780335
DATED : October 11, 2011
INVENTOR(S) : Gopalakrishna B. Prabhu It is certified that error appears in the above-identified patent and that said Letters Patent is hereby corrected as shown below:

Column 6, line 55:

Claim 8, line 5, change "annual" to --annular--.

Claim 7, line 3:

Claim 8, line 20, before "width" insert --the--.

Signed and Sealed this
Twentieth Day of December, 2011

David J. Kappos
*Director of the United States Patent and Trademark Office*

UNITED STATES PATENT AND TRADEMARK OFFICE
CERTIFICATE OF CORRECTION

PATENT NO. : 8,033,895 B2  
APPLICATION NO. : 11/780335  
DATED : October 11, 2011  
INVENTOR(S) : Gopalakrishna B. Prabhu Page 1 of 1

It is certified that error appears in the above-identified patent and that said Letters Patent is hereby corrected as shown below:

Column 6, line 55:

Claim 8, line 5, change "annual" to --annular--.

Column 7, line 3:

Claim 8, line 20, before "width" insert --the--.

This certificate supersedes the Certificate of Correction issued December 20, 2011.

Signed and Sealed this  
Tenth Day of January, 2012

David J. Kappos  
*Director of the United States Patent and Trademark Office*